(12) United States Patent
Pyo

(10) Patent No.: US 6,627,523 B2
(45) Date of Patent: Sep. 30, 2003

(54) METHOD OF FORMING A METAL WIRING IN A SEMICONDUCTOR DEVICE

(75) Inventor: Sung Gyu Pyo, Ichon-Shi (KR)

(73) Assignee: Hynix Semiconductor Inc., Ichon-shi (KR)

( * ) Notice: Subject to any disclaimer, the term of this patent is extended or adjusted under 35 U.S.C. 154(b) by 0 days.

(21) Appl. No.: 09/883,964

(22) Filed: Jun. 20, 2001

(65) Prior Publication Data

US 2002/0019121 A1 Feb. 14, 2002

(30) Foreign Application Priority Data

Jun. 20, 2000 (KR) ........................................ 2000-33982

(51) Int. Cl.$^7$ .............................................. H01L 21/20
(52) U.S. Cl. ...................................... 438/584; 438/734
(58) Field of Search ................................ 438/584, 689, 438/706, 725, 726, 734, 738, 754, 618, 622, 627, 643, 644, 653, 673, 631, 453, 454

(56) References Cited

U.S. PATENT DOCUMENTS

| | | | |
|---|---|---|---|
| 4,810,332 A | * 3/1989 | Pan | ........................... 205/125 |
| 5,164,332 A | * 11/1992 | Kumar | ........................... 438/653 |
| 6,391,771 B1 | * 5/2002 | Naik et al. | ........................... 257/751 |

\* cited by examiner

*Primary Examiner*—W. David Coleman
(74) *Attorney, Agent, or Firm*—Finnegan, Henderson, Farabow, Garrett, & Dunner, L.L.P.

(57) ABSTRACT

There is disclosed a method of forming a metal wiring in a semiconductor device. The method includes forming a seed layer on a semiconductor substrate in which given structures including a lower metal wiring are formed, forming a photosensitive film pattern so that the seed layer can be exposed in the lower wiring portion, filling a metal layer by electroplating method in the pattern portion of the photosensitive film, removing the photosensitive film pattern, forming a diffusion barrier layer spacer on the sidewall of the metal layer, and forming an insulating film on the entire structure. Therefore, the present invention can solve poor contact with a lower wiring that is caused by shortage of processional margin in the process of forming an upper metal wiring in a higher-integration semiconductor device.

8 Claims, 2 Drawing Sheets

METHOD OF FORMING A METAL WIRING IN A SEMICONDUCTOR DEVICE

BACKGROUND OF THE INVENTION

1. Field of the Invention

The invention relates generally to a method of forming a metal wiring in a semiconductor device. More particularly, the present invention relates to a method of forming a metal wiring in a semiconductor device capable of solving a poor contact with a lower wiring due to shortage of process margin in the process of forming an upper metal wiring in a higher-integration semiconductor device.

2. Description of the Prior Art

Referring now to FIGS. 1A~1C, a method of forming a metal wiring in a conventional semiconductor device will be below explained.

Referring now to FIG. 1A, a first insulating film 12 is formed on a semiconductor substrate 11 in which a given structure is formed. After a given region of the first insulating film 12 is etched, a metal layer is formed on the etched region and is then patterned to form a lower metal wiring 13. After forming a second insulating film 14 on the entire structure, a given region of the second insulating film 14 is etched to form a via hole through which the lower metal wiring 13 is exposed.

With respect to FIG. 1B, a diffusion prevention layer 15 and a seed layer 16 are sequentially formed on the entire structure including the via hole. Then, a copper layer 17 is formed by electroplating method so that the via hole can be filled.

Referring to FIG. 1C, the second insulating film 14 is exposed by performing CMP process, thus forming an upper metal wiring.

In case that a metal wiring is formed by means of the above process, however, the following problems occur.

First, as the integration level of semiconductor devices becomes higher, upon lithography process for forming a via hole, there necessarily occurs an alignment problem of a lower wiring and an upper wiring. Therefore, the contact area between the via hole and the wiring is reduced and the contact resistance is thus increased, which may reduce the operating speed of the device.

Second, as the via hole is formed by etching the second insulating film, when even small amount of the second insulating film is remained within the via hole, the via hole could not make an electrical connection with the lower wiring. In order to prevent this, the second insulating film is over-etched. Due to this, there is a problem that the lower wiring is damaged.

Third, as the diffusion barrier layer and the seed layer are formed, in a wiring structure of an ultra-fine structure, the space in which the copper layer can be filled within the second insulating film pattern is minimized. Thus, there is a problem that fill of the copper layer is made impossible or defects are generated, thus lowering reliability of the device.

SUMMARY OF THE INVENTION

It is therefore an object of the present invention to provide a method of forming a metal wiring in a semiconductor device capable of solving the problem caused by a poor contact with a lower wiring due to shortage of process margin in the process of forming an upper metal wiring in a higher-integration semiconductor device.

In order to accomplish the above object, a method of forming a metal wiring in a semiconductor device according to the present invention is characterized in that it comprises the steps of forming a seed layer on a semiconductor substrate in which given structures including a lower metal wiring are formed; forming a photosensitive film on said seed layer; patterning said photosensitive film to exposed said seed layer on the portion in which said lower metal wiring is formed; forming a metal layer on said exposed seed layer by electroplating method; removing said photosensitive film; forming a diffusion barrier layer on the entire structure including said metal layer; sequentially etching said diffusion barrier layer and said seed layer by a blanket etch process, thereby forming an upper metal wiring in which said seed layer is remained below said metal layer and a diffusion barrier layer spacer is formed on the sidewall of said metal layer; and forming an insulating film on the entire structure including said upper metal wiring, and then performing planarization process to expose a top of said upper metal wiring.

BRIEF DESCRIPTION OF THE DRAWINGS

The aforementioned aspects and other features of the present invention will be explained in the following description, taken in conjunction with the accompanying drawings, wherein.

DETAILED DESCRIPTION OF PREFERRED EMBODIMENTS

The present invention will be described in detail by way of a preferred embodiment with reference to accompanying drawings.

Figure 1A:
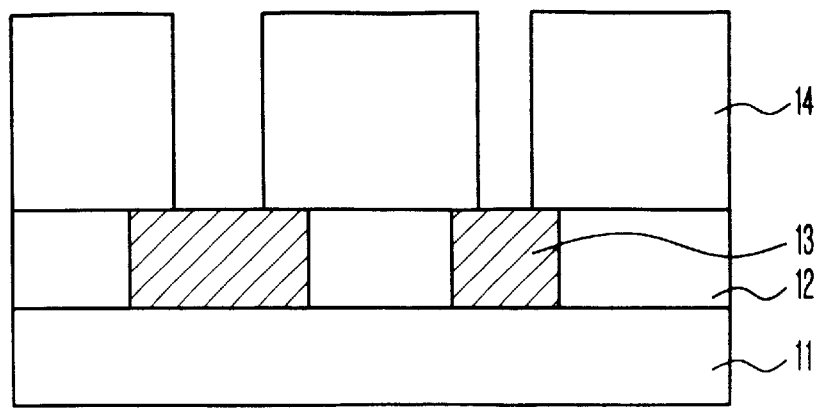
FIGS. 1A~1C are cross-sectional views for sequentially illustrating a method of forming a metal wiring in a conventional semiconductor device.
Figure 1B:
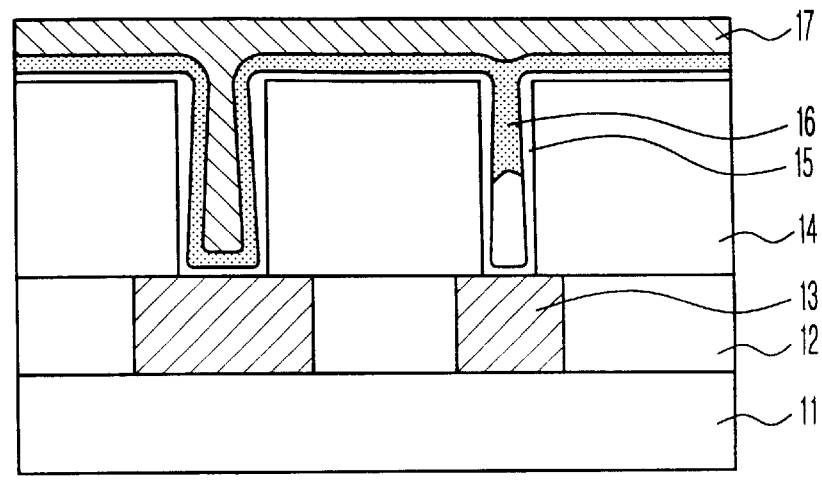
Figure 1C:
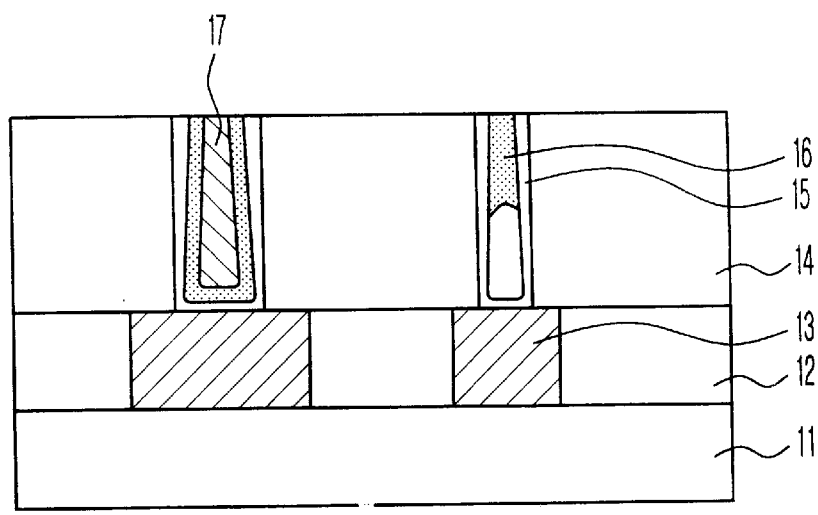
Figure 2A:
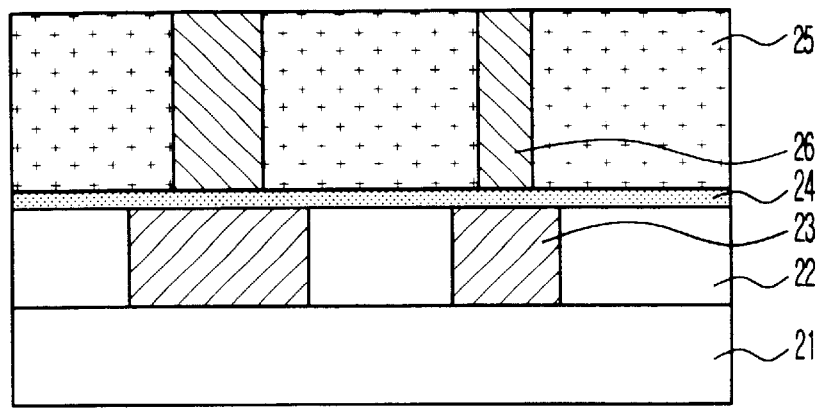
FIGS. 2A~2C are cross-sectional views for sequentially illustrating a method of forming a metal wiring in a semiconductor device according to the present invention.
Figure 2B:
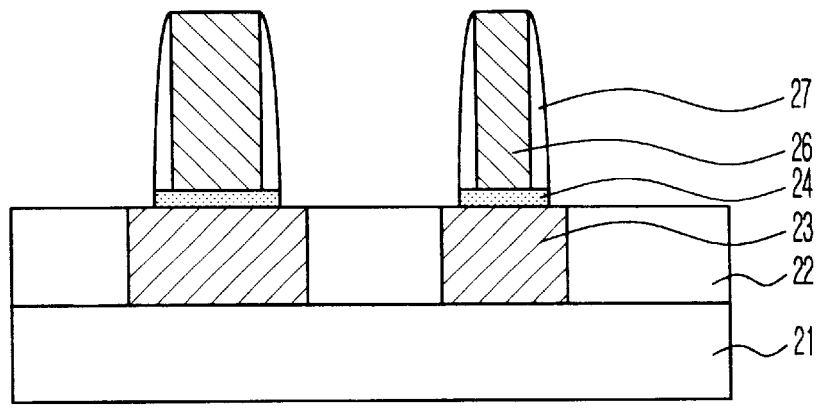
Figure 2C:
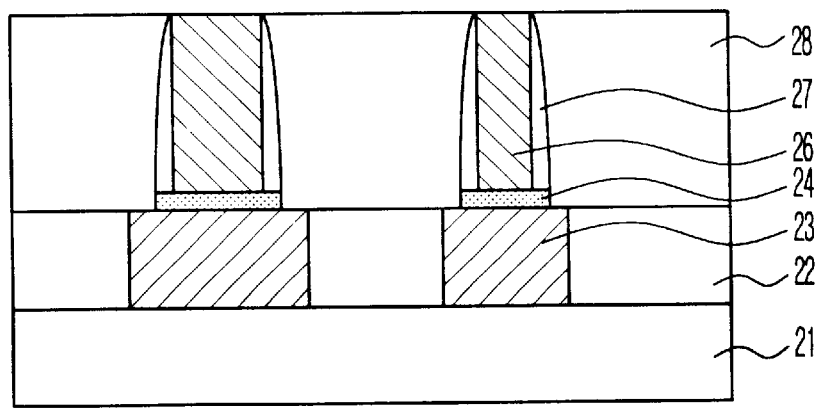

Referring now to FIGS. 2A~2C, a method of forming a metal wiring in a semiconductor device according to the present invention will be below explained in detail.

Referring now to FIG. 2A, a first insulating film is formed on a semiconductor substrate 21 in which given structures are formed. Then, after a given region of the first insulating film 22 is etched, a metal layer is formed in the etched region and is then patterned, thus forming a lower metal wiring 23. Next, a seed layer 24 is formed on the entire structure. The seed layer 24 is formed of one of aluminum, titanium, tungsten and copper in thickness of 5~1000 Å by means of PVD method, CVD method or ALD (atomic layer deposition) method. After forming a photosensitive film 25 by a desired wiring height on the entire structure, a portion that will become an upper electrode is patterned to expose the portion of the lower wiring 23. Then, a copper layer 26 is formed on the portion of the patterned photosensitive film 25. An aluminum layer may be formed instead of the copper layer 26. Electroplating method for forming the copper layer 26 may employ a multi-step plating method using a forward DC plating, a pulse-reverse pulse plating, etc.

Referring now to FIG. 2B, after only the copper layer 26 is remained by removing the photosensitive film 25, a diffusion barrier layer 27 is formed on the entire structure. Then, the diffusion barrier layer 27 and the seed layer 24 are etched by means of blanket etch process. Thereby, the diffusion barrier layer 27 is formed on the sidewall of the copper layer 26 in the shape of a spacer and an upper wiring in which the seed layer 24 is formed below the copper layer 26 is formed. The diffusion barrier layer 27 is formed in thickness of 5~1000 Å. The diffusion barrier layer 27 is formed of one of an ionized PVD TiN film, a CVD TiN film, a MOCVD TiN film, an ionized PVD Ta film, an ionized PVD TaN film, a CVD Ta film, a CVD TaN film, a CVD WN film, a CVD TiAlN film, a CVD TiSiN film, a CVD TaSiN film, a PVD TiAlN film, a PVD TiSiN film, and a PVD TaSiN film.

Referring now to FIG. 2C, a second insulating film 28 is formed on the entire structure so that between-the upper wiring can be filled, thus completing the process of forming a metal wiring. The second insulating film 28 may be formed using an oxide film or a film having a low dielectric constant.

As mentioned above, according to the present invention, as the exposed portion of the seed layer is limited to the portion in which the photosensitive film is patterned in the copper layer deposited by electroplating method, only the portion through which the seed layer is exposed is deposited. Therefore, the copper layer is deposited by self-aligned electroplating method. Also, in an ultra-fin structure, as there is no problem that the space filled within the pattern due to application of the diffusion barrier layer or the seed layer is reduced, wiring filling can be easily performed without defect.

The method proposed by the present invention is advantageous in forming a wiring without defects, as in the case of the process of manufacturing ultra-fine semiconductor devices of below 0.10 m.

Meanwhile, a current diffusion barrier layer applied in the ultra-fine structure using the damascene must be formed by using difficult methods such as CVD method or ALD method. However, the present invention can significantly improve processional difficulties since it can employ PVD method instead of CVD method or ALD method. In addition, the present invention can do without the process of forming a seed layer using CVD method.

The present invention has been described with reference to a particular embodiment in connection with a particular application. Those having ordinary skill in the art and access to the teachings of the present invention will recognize additional modifications and applications within the scope thereof.

It is therefore intended by the appended claims to cover any and all such applications, modifications, and embodiments within the scope of the present invention.

What is claimed is:

1. A method of forming a metal wiring in a semiconductor device, comprising the steps of;

forming a seed layer on a semiconductor substrate in which given structures including a lower metal wiring are formed, wherein said seed layer is formed of one of aluminum, titanium, and tungsten;

forming a photosensitive film on said seed layer;

patterning said photosensitive film to expose said seed layer on a portion in which said lower metal wiring is formed;

forming a metal layer on said exposed seed layer by an electroplating method;

removing said photosensitive film;

forming a diffusion barrier layer on the entire structure including said metal layer;

sequentially etching said diffusion barrier layer and said seed layer by a blanket etch process, thereby forming an upper metal wiring in which said seed layer remains below said metal layer and a diffusion barrier layer spacer remains on a sidewall of said metal layer; and forming an insulating film on the entire structure including said upper metal wiring, and then performing a planarization process to expose a top of said upper metal wiring.

2. The method of forming a metal wiring in a semiconductor device according to claim 1, wherein said seed layer is formed by means of one of PVD method, CVD method and ALD method.

3. The method of forming a metal wiring in a semiconductor device according to claim 1, wherein said seed layer is formed in thickness of 5~1000 Å.

4. The method of forming a metal wiring in a semiconductor device according to claim 1, wherein said metal layer is formed of a copper layer or an aluminum layer.

5. The method of forming a metal wiring in a semiconductor device according to claim 1, wherein said electroplating method is a multi-step plating method using a forward DC plating or a pulse-reverse pulse plating.

6. The method of forming a metal wiring in a semiconductor device according to claim 1, wherein said diffusion barrier layer is formed of one of an ionized PVD TiN film, a CVD TiN film, a MOCVD TiN film, an ionized PVD Ta film, an ionized PVD TaN film, a CVD Ta film, a CVD TaN film, a CVD WN film, a CVD TiAlN film, a CVD TiSiN film, a CVD TaSiN film, a PVD TiAlN film, a PVD TiSiN film, and a PVD TaSiN film.

7. The method of forming a metal wiring in a semiconductor device according to claim 1, wherein said diffusion barrier layer is formed in thickness of 5~1000 Å.

8. The method of forming a metal wiring in a semiconductor device according to claim 1, wherein said insulating film is a film having a low dielectric constant.

* * * * *

UNITED STATES PATENT AND TRADEMARK OFFICE
CERTIFICATE OF CORRECTION

PATENT NO. : 6,627,523 B2
DATED : September 30, 2003
INVENTOR(S) : Sung Gyu Pyo

It is certified that error appears in the above-identified patent and that said Letters Patent is hereby corrected as shown below:

Title page,
Item [57], ABSTRACT,
Line 1, "There is disclosed" should read -- Disclosed is --.
Line 2, "device. The method" should read -- device which --.
Line 11, "Therefore, the present invention can solve" should read -- The problem of --.
Line 14, "device." should read -- device is avoided --.

Column 4,
Line 26, "of PVD method, CVD" should read -- of a physical vapor deposition method, a chemical vapor deposition --
Line 27, "and ALD" should read -- and an atomic layer deposition --.
Line 30, "of 5~1000 Å." should read -- of between 5 and 1000 Å. --.
Line 33, "of a copper layer or an aluminum layer." should read -- of copper or aluminum. --.
Lines 40, 41, 42 and 45, "PVD" should read -- physical vapor deposition --.
Line 41, "CVD" should read -- chemical vapor deposition --.
Line 41, "a MOCVD" should read -- an organic metal chemical vapor deposition --.
Line 42, both occurrences of "CVD" should read -- chemical vapor deposition --.
Line 43, all three occurrences of "CVD" should read -- chemical vapor deposition --.
Line 44, both occurrences of "PVD" should read -- physical vapor deposition --.
Line 48, "thickness of 5~1000 Å." should read -- thickness between 5 and 1000 Å. --.

Signed and Sealed this

Twentieth Day of July, 2004

JON W. DUDAS
*Acting Director of the United States Patent and Trademark Office*